US011764527B2

(12) United States Patent
Park et al.

(10) Patent No.: US 11,764,527 B2
(45) Date of Patent: Sep. 19, 2023

(54) CONNECTOR

(71) Applicant: SAMSUNG DISPLAY CO., LTD., Yongin-si (KR)

(72) Inventors: Ki-Yong Park, Seoul (KR); Seyoung Oh, Osan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/437,945

(22) PCT Filed: Apr. 16, 2020

(86) PCT No.: PCT/KR2020/005101
§ 371 (c)(1),
(2) Date: Sep. 10, 2021

(87) PCT Pub. No.: WO2020/231026
PCT Pub. Date: Nov. 19, 2020

(65) Prior Publication Data

US 2022/0173554 A1 Jun. 2, 2022

(30) Foreign Application Priority Data

May 16, 2019 (KR) ........................ 10-2019-0057403

(51) Int. Cl.
*H01R 24/60* (2011.01)
*H01R 12/79* (2011.01)
(Continued)

(52) U.S. Cl.
CPC ............. *H01R 24/60* (2013.01); *H01R 12/79* (2013.01); *H01R 13/24* (2013.01); *H01R 13/629* (2013.01); *H01R 2201/00* (2013.01)

(58) Field of Classification Search
CPC ........ H01R 27/00; H01R 24/60; H01R 12/79; H01R 13/24; H01R 13/629; H01R 2201/00
(Continued)

(56) References Cited

U.S. PATENT DOCUMENTS 5,520,550 A 5/1996 Okabe
7,021,971 B2 * 4/2006 Chou ............... G06K 19/07732 439/660
(Continued)

FOREIGN PATENT DOCUMENTS

CN 101178427 A 5/2008
CN 105281071 A 1/2016
(Continued)

OTHER PUBLICATIONS

International Search Report dated Jul. 21, 2020, for PCT/KR2020/005101, citing the above reference(s).
(Continued)

*Primary Examiner* — Gary F Paumen
(74) *Attorney, Agent, or Firm* — CANTOR COLBURN LLP

(57) ABSTRACT

A connector includes a housing having a sidewall portion, a first bottom portion protruding from the sidewall portion, and a second bottom portion protruding from the sidewall portion and facing the first bottom portion and, a contact terminal disposed in an internal space of the housing. The sidewall portion includes a first partial sidewall portion having a first width and a second partial sidewall portion having a second width different from the first width. The sidewall portion, the first bottom portion, and the second bottom portion define the internal space.

17 Claims, 10 Drawing Sheets

(51) Int. Cl.
*H01R 13/24* (2006.01)
*H01R 13/629* (2006.01)

(58) Field of Classification Search
USPC .................................................. 439/217, 218
See application file for complete search history.

(56) References Cited

U.S. PATENT DOCUMENTS

| | | | | |
|---|---|---|---|---|
| 7,440,287 | B1 * | 10/2008 | Ni .......................... | H01R 27/00 439/945 |
| 7,568,957 | B2 * | 8/2009 | Suzuki ................. | G01R 1/0416 439/842 |
| 7,656,179 | B2 * | 2/2010 | Suzuki ................... | G01R 31/70 324/754.08 |
| 8,087,227 | B2 | 1/2012 | Feuerstein | |
| 9,407,035 | B2 | 8/2016 | Arimai et al. | |
| 9,985,371 | B1 | 5/2018 | Ashibu et al. | |
| 10,008,795 | B2 * | 6/2018 | Yang .................... | H01R 12/721 |
| 10,566,721 | B2 | 2/2020 | Nakajima et al. | |
| 2003/0013336 | A1 * | 1/2003 | Kuroda ................ | H01R 12/714 439/218 |
| 2003/0095386 | A1 * | 5/2003 | Le .......................... | H01R 27/00 361/737 |
| 2008/0113527 | A1 | 5/2008 | Suzuki et al. | |
| 2008/0129321 | A1 * | 6/2008 | Suzuki ................... | G01R 31/70 324/750.25 |
| 2017/0194728 | A1 | 7/2017 | Yang et al. | |

FOREIGN PATENT DOCUMENTS

| | | | |
|---|---|---|---|
| JP | 11250994 | A | 9/1999 |
| JP | 2003282181 | A | 10/2003 |
| JP | 2006114317 | A | 4/2006 |
| JP | 4455406 | B2 | 4/2010 |
| JP | 2014175271 | A | 9/2014 |
| KR | 101938765 | B1 | 1/2019 |
| KR | 101941073 | B1 | 1/2019 |
| KR | 101946651 | B1 | 2/2019 |
| KR | 101947076 | B1 | 2/2019 |
| KR | 1020190015996 | A | 2/2019 |

OTHER PUBLICATIONS

Written Opinion for PCT/KR2020/005101 dated Jul. 21, 2020, citing the above reference(s).

* cited by examiner

CONNECTOR

TECHNICAL FIELD

Embodiments of the invention relate to a connector having improved coupling stability.

BACKGROUND ART

A display panel typically includes a plurality of data lines and a plurality of gate lines. In order to apply a driving signal to the data lines and the gate lines, display panel is connected to a printed circuit board for transmitting the driving signal. An inspection device for inspecting the operation of the display panel may be connected to the printed circuit board through a connector.

In order to secure the reliability of the display panel, a procedure for verifying the operational characteristics of the display panel is desired in a development and manufacturing process thereof. The display panel may be connected to a device for verifying operational characteristics of a display panel through the connector connected to the printed circuit board.

DISCLOSURE OF THE INVENTION

Technical Problem

Embodiments of the invention provide a connector having improved coupling stability.

Technical Solution

An embodiment of a connector according to the invention includes a housing having a sidewall portion, a first bottom portion protruding from the sidewall portion, and a second bottom portion protruding from the sidewall portion and facing the first bottom portion, and a contact terminal disposed in an internal space of the housing. In such an embodiment, the sidewall portion includes a first partial sidewall portion having a first width and a second partial sidewall portion having a second width different from the first width. In such an embodiment, the sidewall portion, the first bottom portion, and the second bottom portion define the internal space.

In an embodiment, the contact terminal may be disposed the second bottom portion.

In an embodiment, the contact terminal may protrude from the second bottom portion toward the first bottom portion.

In an embodiment, the first bottom portion may be adjacent to the first partial sidewall portion, and the second bottom portion may be adjacent to the second partial sidewall portion.

In an embodiment, the first width may be less than the second width.

In an embodiment, a distance between the first bottom portion and the second bottom portion may be greater than a distance between the first bottom portion and the first partial sidewall portion.

In an embodiment, a third partial sidewall portion disposed between the first partial sidewall portion and the second partial sidewall portion may be further included.

In an embodiment, the third partial sidewall portion may have a third width, and the third width may be greater than the first width but less than the second width.

In an embodiment, the first partial sidewall portion, the second partial sidewall portion, and the third partial sidewall portion may collectively define a stepped shape.

In an embodiment, a distance between the first bottom portion and the third partial sidewall portion may be about 0.6 mm.

In an embodiment, a distance between the first bottom portion and the second partial sidewall portion may be about 0.8 mm.

In an embodiment, a distance between the first bottom portion and the second bottom portion may be about 1 mm.

An embodiment of a connector according to the invention includes a housing having a sidewall portion, a first bottom portion protruding from the sidewall portion, and a second bottom portion protruding from the sidewall portion and facing the first bottom portion, a contact terminal disposed in an internal space of the housing, and spacing control unit disposed inside the housing. In such an embodiment, the sidewall portion, the first bottom portion, and the second bottom portion define the internal space.

In an embodiment, the second bottom portion may be slidable along a thickness direction toward or away from the first bottom portion.

In an embodiment, the contact terminal may be disposed the second bottom portion.

In an embodiment, the contact terminal may protrude from the second bottom portion toward the first bottom portion.

In an embodiment, the spacing control unit may include a material having elasticity.

In an embodiment, the connector may further include a control unit coupled to the spacing control unit to control a distance between the first bottom portion and the second bottom portion.

In an embodiment, a first end of the spacing control unit may be coupled to the second bottom portion, and a second end of the spacing control unit may be coupled to the control unit.

In an embodiment, the control unit may include a dial disposed on one surface of the sidewall portion to control the spacing control unit.

Advantageous Effects

According to embodiments of the invention, a connector may include a housing in a stepped shape and having a first distance, a second distance, and a third distance, or may include a spacing control unit capable of adjusting the distance between a first bottom portion and a second bottom portion. Therefore, the connector may be stably coupled to a main circuit board regardless of the thickness of the main circuit board. Therefore, the contact failure between the main circuit board and the connector may be prevented.

MODE FOR CARRYING OUT THE INVENTION

Figure 1:
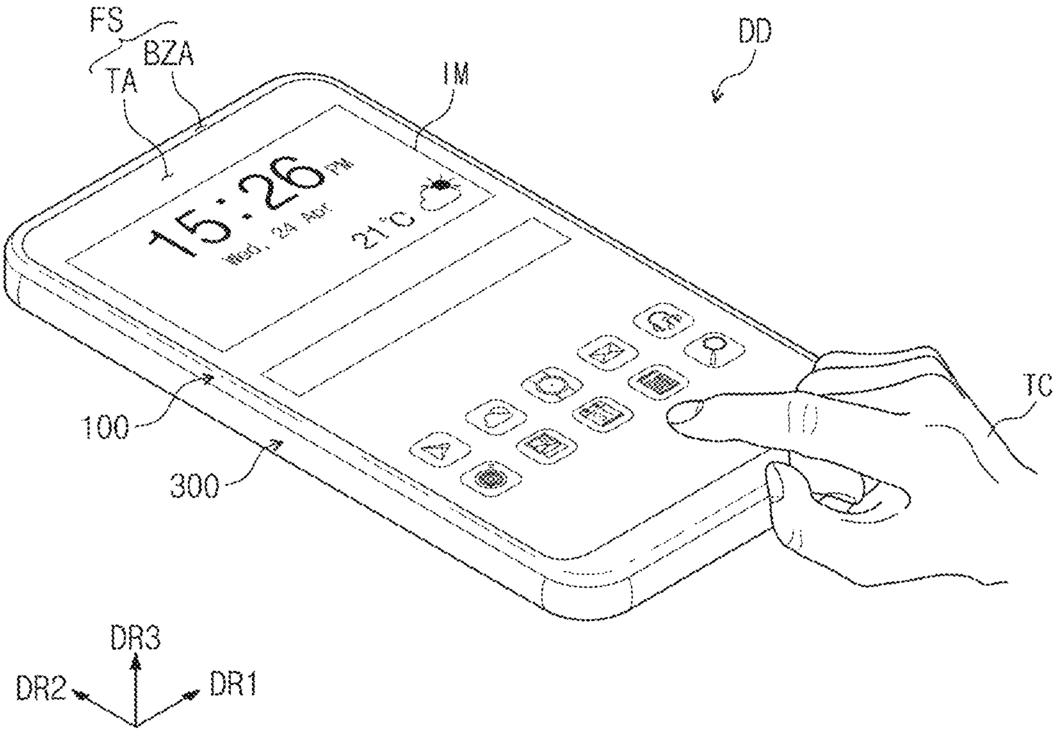
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween. In contrast, when an element is referred to as being "directly on," "connected directly to," or "coupled directly to" another element, there are no intervening elements present.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

It will be understood that the terms "comprise" and/or "comprising", "includes" and/or "including," or "have" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
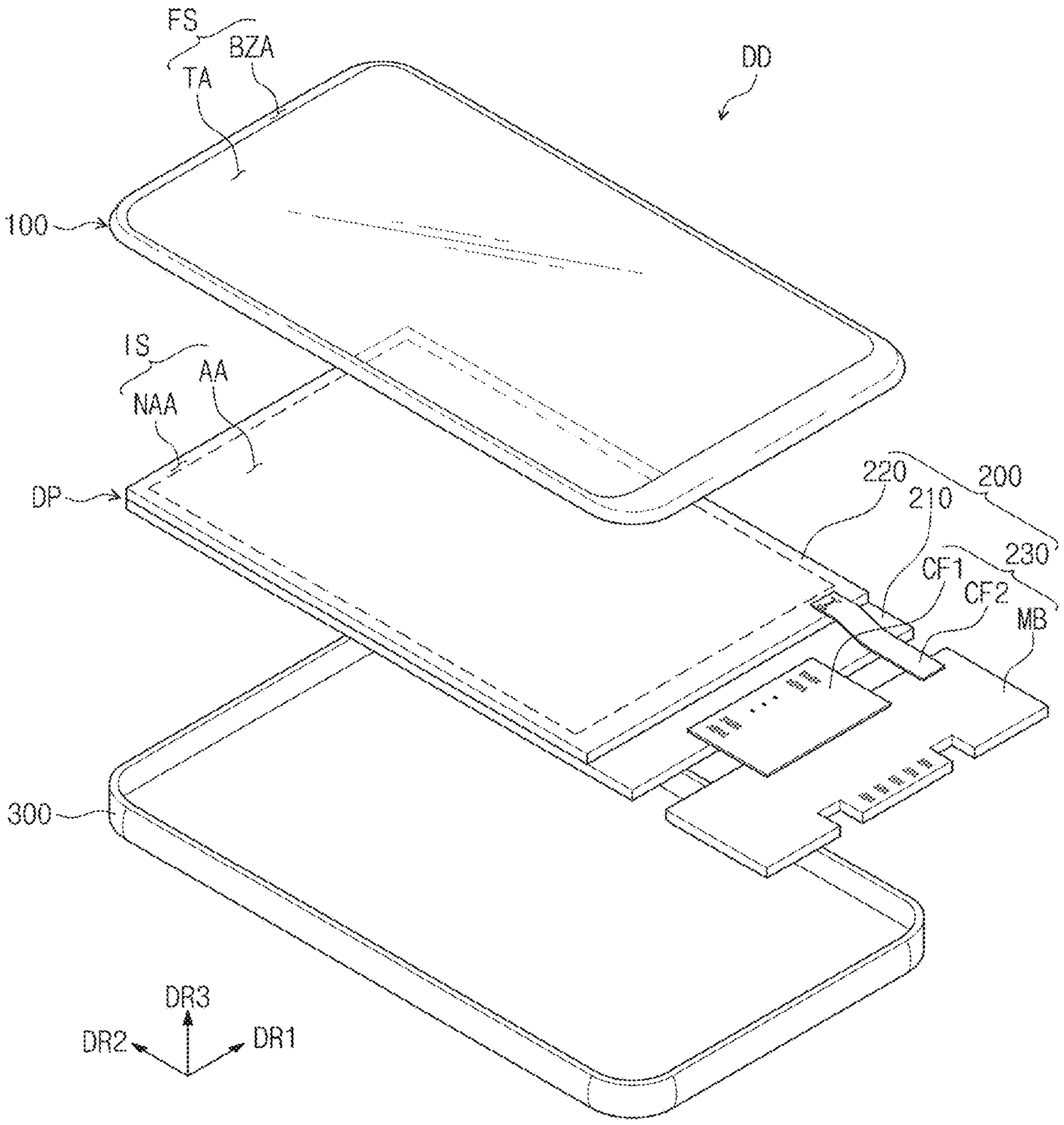
FIG. 2 is an exploded perspective view of a display device according to an embodiment of the invention.

FIG. 1 is a perspective view of a display device according to an embodiment of the invention, and FIG. 2 is an exploded perspective view of a display device according to an embodiment of the invention.

Referring to FIG. 1 and FIG. 2, an embodiment of a display device DD may be a device activated by an electrical signal. The display device DD may include various embodiments. In an embodiment, the display device DD may be applied to large-sized display devices such as televisions and monitors and also to small-and-medium-sized display devices such as mobile phones, tablet computers, car navigation systems, game consoles, and smart watches. In one embodiment, for example, the display device DD may be a smart phone, as shown in FIG. 1.

The display device DD may display an image IM on a front surface thereof. The front surface may be defined to be parallel to a plane defined by a first direction DR1 and a second direction DR2. The front surface may include a transmissive region TA and a bezel region BZA adjacent to the transmissive region TA.

The display device DD may display the image IM on the transmissive region TA. The image IM may include at least any one of a still image and a dynamic image. In one embodiment, for example, as shown in FIG. 1, the image IM may be a watch window and icons.

The transmissive region TA may have a quadrangular shape parallel to each of the first direction DR1 and the second direction DR2, for example. Alternatively, the transmissive region TA may have one of other various shapes, and is not limited to any one embodiment.

The bezel region BZA may have a predetermined color. The bezel region BZA may be a region having a relatively low light transmittance compared to the transmissive region TA. The bezel region BZA may be adjacent to the transmissive region TA. The bezel region BZA may define the shape of the transmissive region TA. The bezel region BZA may surround the transmissive region TA, for example. The bezel region BZA may be disposed adjacent only to one side of the transmissive region TA, or may be omitted. Embodiments of the display device DD according to the invention may be variously modified, and are not limited to any one embodiment.

The normal direction of the front surface may correspond to a thickness direction DR3 (hereinafter, a third direction) of the display device DD. In an embodiment, a front surface (or an upper surface) and a back surface (or a lower surface) of each member may be defined on the basis of a direction in which the image IM is displayed. The front surface and the back surface may face each other in the third direction DR3.

Herein, directions indicated by the first to third directions DR1, DR2, and DR3 are relative concepts, and may thus be converted to other directions. Hereinafter, first to third directions are directions respectively indicated by the first to third directions DR1, DR2, DR3, and are given the same reference numerals. In addition, in the specification, a surface defined by the first direction DR1 and the second direction DR2 is defined as a plane, and "viewed on a plane" or "viewed in a plan view" may be defined as being viewed from the third direction DR3.

The third direction DR3 may be a direction intersecting the first direction DR1 and the second direction DR2. The first direction DR1, the second direction DR2, and the third direction DR3 may be perpendicular to each other.

An embodiment of the display device DD according to the invention may sense an external input TC applied from the outside. The external input TC may include various forms of external inputs, such as a part of a user's body, light, heat, or pressure. In an embodiment, the display device DD may sense not only an input contacting the display device DD but also an input in close proximity therewith or adjacent thereto.

In an embodiment, the display device DD may include a window 100, a display module 200, and an external case 300. In such an embodiment, the window 100 and the external case 300 may be coupled to each other, and may collectively configure or define the appearance of the display device DD.

The window 100 may be disposed on the display module 200 to cover an upper surface IS of the display module 200. The window 100 may include an optically transparent insulation material. In one embodiment, for example, the window 100 may include a glass substrate, a sapphire substrate, or a plastic film. The window 100 may have a multi-layered structure or a single-layered structure. In one embodiment, for example, the window 100 may have a laminated structure in which a plurality of plastic films are adhered to each other with an adhesive therebetween, or a laminated structure in which a glass substrate and a plastic film are adhered to each other with an adhesive therebetween.

The window 100 may include a front surface FS exposed to the outside. The front surface FS of display device DD may substantially be defined by the front surface FS of the window 100.

The display module 200 may display the image IM, and may sense the external input TC. The display module 200 may include the upper surface IS having a display region AA and a non-display region NAA. The display region AA may be a region activated by an electrical signal.

In the embodiment, the display region AA may be a region in which the image IM is displayed, and at the same time, may be a region in which the external input TC is sensed. The transmissive region TA may overlap the display region AA. In one embodiment, for example, the transmissive region TA may overlap the upper surface or at least a portion of the display region AA. Accordingly, a user may view the image IM through the transmissive region TA, or may provide the external input TC, for example. In an alternative embodiment, in the display region AA, a region in which the image IM is displayed and a region in which the external input TC is sensed may be separated from each other. However, the embodiments of the invention are not limited to any one embodiment.

The non-display region NAA may be a region covered by the bezel region BZA. The non-display region NAA may be adjacent to the display region AA. The non-display region NAA may surround the display region AA. In the non-display region NAA, a driving circuit or a driving wire for driving the display region AA may be disposed.

In an embodiment, the display module 200 may be assembled in a flat state in which the display region AA and the non-display region NAA face toward the window 100, for example. In an alternative embodiment, a portion of the non-display region NAA in the display module 200 may be bent. In such an embodiment, a portion of the non-display region NAA faces the back surface of the display device DD, and thus, a portion of the display device DD may also be assembled in a bent state. In another alternative embodiment of the display module 200 according to the invention, the non-display region NAA may be omitted.

The display module 200 may include a display panel DP and a driving circuit 230. The display panel DP may include a light-receiving type display panel or a light-emitting type display panel. The light-receiving type display panel may be, for example, a liquid crystal display panel. The light-emitting type display panel may be, for example, an organic light emitting display panel or a quantum dot light emitting display panel. A light emitting layer of the organic light emitting display panel may include an organic light emitting material. A light emitting layer of the quantum dot light emitting display panel may include quantum dots, quantum loads, and the like. However, this is only exemplary. In embodiments of the invention, the display panel DP is not particularly limited. In an embodiment of the invention, the display panel DP may be an organic light emitting display panel.

The display panel DP may include a display unit 210 and a sensing unit 220. The display unit 210 may be a component which substantially generates the image IM. The image IM generated by the display unit 210 may be displayed on the upper surface IS through the transmissive region TA to be viewed by a user from the outside. The sensing unit 220 may sense the external input TC applied from the outside. The driving circuit 230 may be electrically connected to the display unit 210 and the sensing unit 220.

The driving circuit 230 may include a first circuit board CF1, a second circuit board CF2, and a main circuit board MB. The first circuit board CF1 may be electrically connected to the display unit 210. The first circuit board CF1 may connect the display unit 210 and the main circuit board MB. In an embodiment, the first circuit board CF1 may be a flexible circuit film, for example. Alternatively, the first circuit board CF1 may be a rigid board.

The first circuit board CF1 may be connected to pads (display pads) of the display unit 210 to be disposed on the non-display region NAA. The first circuit board CF1 may provide the display unit 210 with an electrical signal for driving the display unit 210. The electrical signal may be generated from the first circuit board CF1 or from the main circuit board MB.

The second circuit board CF2 may be electrically connected to the sensing unit 220. The second circuit board CF2 may connect the sensing unit 220 and the main circuit board MB. In an embodiment, the second circuit board CF2 may be a flexible circuit film, for example. Alternatively, the second circuit board CF2 may not be connected to the main circuit board MB, and the second circuit board CF2 may be a rigid board.

The second circuit board CF2 may be connected to pads (display pads) of the sensing unit 220 to be disposed on the non-display region NAA. The second circuit board CF2 may provide the sensing unit 220 with an electrical signal for driving the sensing unit 220. The electrical signal may be generated from the second circuit board CF2, or from the main circuit board MB.

The main circuit board MB may include various driving circuits for driving the display module 200 or circuits for supplying power. In an embodiment, the first circuit board CF1 and the second circuit board CF2 may be connected to the main circuit board MB, for example. In an alternative embodiment of the display module 200 according to the invention, the display unit 210 and the sensing unit 220 may be connected to different main circuit boards MB, and the second circuit board CF2 may not be connected to the main circuit board MB. However, the embodiments of the invention are not limited thereto.

The external case 300 may be disposed under the display module 200. The external case 300 and the window 100 may configure the appearance of the display device DD together. The external case 300 may include a relatively rigid material compared to the display module 200. In an embodiment, the external case 300 may be integrally formed as a single unitary body, for example, as illustrated in FIG. 2. Alternatively, the external case 300 may include a plurality of bodies assembled together. In one embodiment, for example, the external case 300 may include a plurality of frames and/or plates including or made of glass, a plastic, and a metal. The external case 300 may provide a predetermined accommodation space. The display module 200 may be accommodated in the accommodation space and be protected from external impact.

Figure 3:
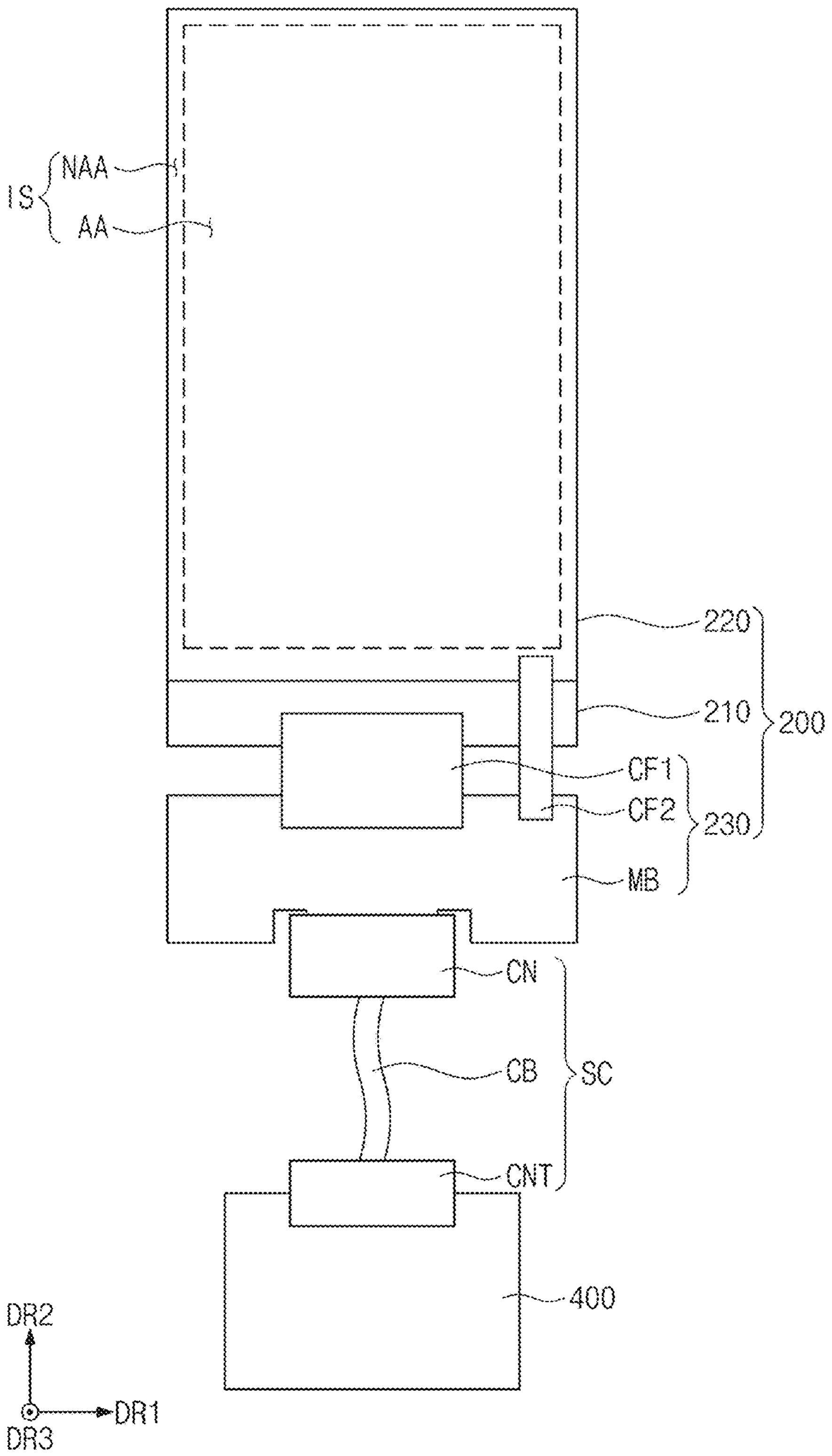
FIG. 3 is a plan view of a display module connected to an inspection module according to an embodiment of the invention.

FIG. 3 is a plan view of a display module connected to an inspection module according to an embodiment of the invention.

Referring to FIG. 3, an embodiment of the display module 200 may be electrically connected to an inspection module 400 through a signal cable SC.

The signal cable SC may transmit an inspection driving signal to the display module 200. The signal cable SC may include a connector CN, a cable CB, and an inspection connector CNT. The connector CN may be connected to the main circuit board MB. The cable CB may connect the connector CN and the inspection connector CNT to each other. The inspection connector CNT may be connected to the inspection module 400.

The inspection module 400 may perform an inspection of the display module 200. The inspection module 400 may include an inspection control circuit. The inspection driving signal may be generated from the inspection control circuit. The inspection driving signal may be transmitted to the display module 200. The display module 200 received the inspection driving signal is driven, so that a test image may be displayed in the display region AA. Therefore, based on the inspection driving signal generated from the inspection control circuit, whether the display module 200 operates normally or not may be determined.

Figure 4:
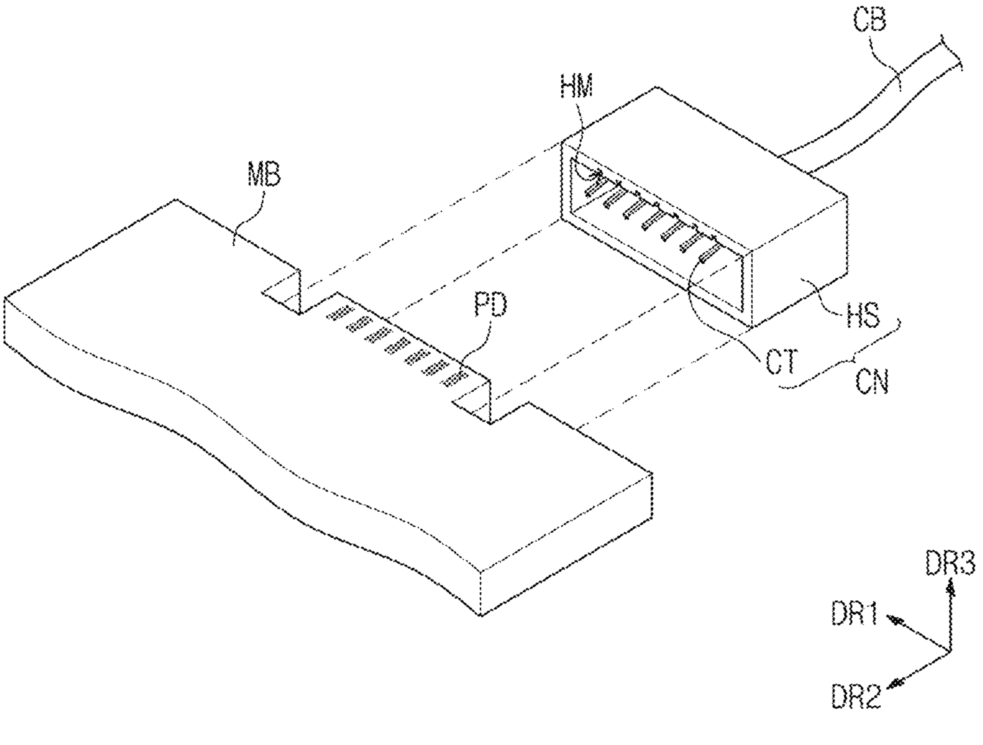
FIG. 4 is a perspective view illustrating portions of a main circuit board and a connector according to an embodiment of the invention.

FIG. 4 is a perspective view illustrating portions of a main circuit board and a connector according to an embodiment of the invention.

Referring to FIG. 4, an embodiment of the connector CN may be coupled to the main circuit board MB. The main circuit board MB may include a plurality of pads PD. The plurality of pads PD may be arranged in the first direction DR1. FIG. 4 illustrates an embodiment where the main circuit board MB includes 7 pads PD, but the number of pads is not limited thereto.

The connector CN may include a housing HS and a plurality of contact terminals CT. The housing HS may configure the external appearance of the connector CN. The plurality of contact terminals CT may be arranged in the first direction DR1. FIG. 4 illustrates an embodiment where the connector CN includes 7 contact terminals CT, but the number of contact terminals is not limited thereto.

The plurality of pads PD may be electrically connected to the plurality of contact terminals CT. The plurality of pads PD (hereinafter, a pad) may come in contact with the plurality of contact terminals CT (hereinafter, a contact terminal) in a one-to-one correspondence.

Figure 5:
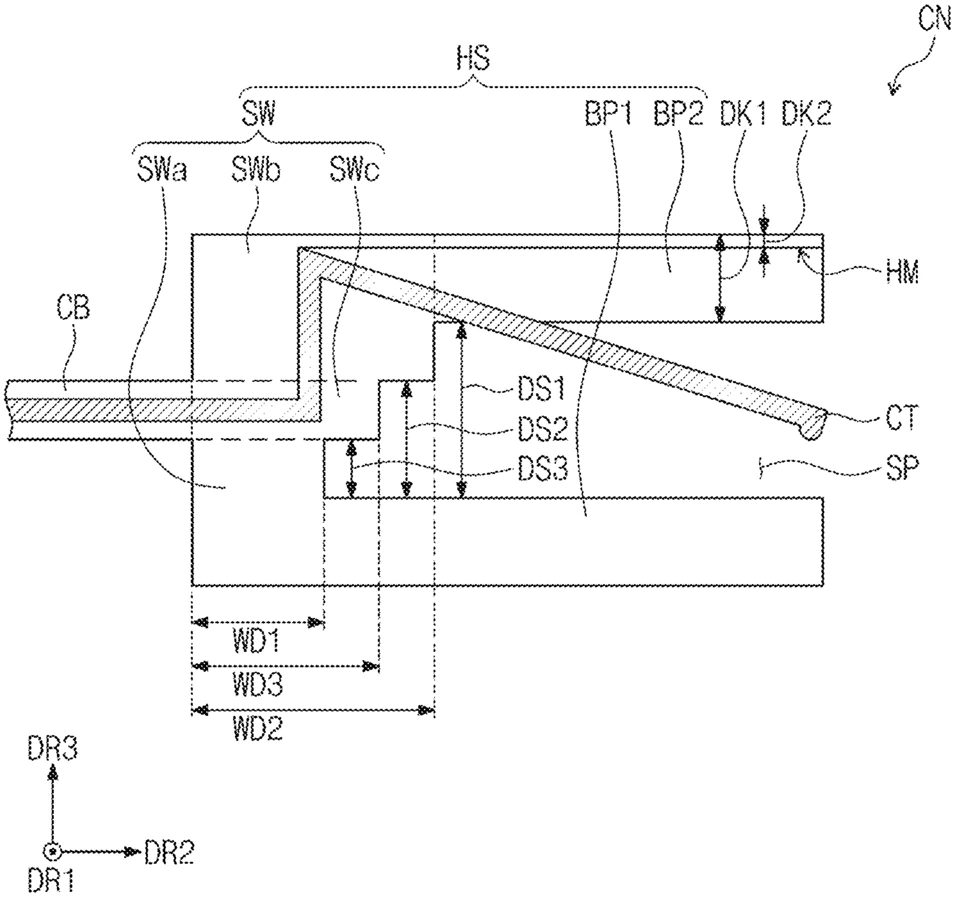
FIG. 5 is a transmissive cross-sectional view illustrating a portion of a connector according to an embodiment of the invention.

FIG. 5 is a transmissive cross-sectional view illustrating a portion of a connector according to an embodiment of the invention.

Referring to FIG. 5, the connector CN may include the housing HS and the contact terminal CT. The housing HS may include a sidewall portion SW, a first bottom portion BP1 protruding from the sidewall portion SW, and a second bottom portion BP2 protruding from the sidewall portion SW and facing the first bottom portion BP1.

The sidewall portion SW may include a first partial sidewall portion SWa, a second partial sidewall portion SWb, and a third partial sidewall portion SWc. The first partial sidewall portion SWa may have a first width WD1 in the second direction DR2. The second partial sidewall portion SWb may have a second width WD2 in the second direction DR2. The third partial sidewall portion SWc may be disposed between the first partial sidewall portion SWa and the second partial sidewall portion SWb. The third partial sidewall portion SWc may have a third width WD3 in the second direction DR2.

The first width WD1 may be less than the second width WD2. The third width WD3 may be greater than the first width WD1 but less than the second width WD2. The first partial sidewall portion SWa, the second partial sidewall portion SWb, and the third partial sidewall portion SWc may have a stepped shape.

The first bottom portion BP1 may be adjacent to the first partial sidewall portion SWa. The second bottom portion BP2 may be adjacent to the second partial sidewall portion SWb. A first distance DS1 between the first bottom portion BP1 and the second bottom portion BP2 may be greater than a second distance DS2 between the first bottom portion BP1 and the second partial sidewall portion SWb. The second distance DS2 between the first bottom portion BP1 and the second partial sidewall portion SWb may be greater than a third distance DS3 between the first bottom portion BP1 and the third partial sidewall portion SWc.

An internal space SP may be defined by the sidewall portion SW, the first bottom portion BP1, and the second bottom portion BP2.

In an embodiment, as shown in FIG. 5, the sidewall portion SW includes or is composed of first to third partial sidewall portions SWa, SWb, and SWc having different widths from each other. However, the embodiments of the invention are not limited thereto. In one alternative embodiment, for example, in an embodiment of the invention, the sidewall portion SW may be composed of two partial sidewall portions having different widths from each other, or may be composed of 4 or more partial sidewall portions having different widths from each other.

The contact terminal CT may be disposed in the internal space SP. The contact terminal CT may be disposed in the second bottom portion BP2. An end of the contact terminal CT may protrude from the second bottom portion BP2 toward the first bottom portion BP1 in the third direction DR3 to effectively come into contact with the pad PD (see FIG. 5).

A groove HM may be defined inside the housing HS. In one embodiment, for example, the groove HM may be defined in the second bottom portion BP of the housing HS. When the main circuit board MB (see FIG. 5) is inserted into the housing HS, the contact terminal CT may be accommodated in the groove HM. The thickness of the second bottom portion BP2 may be different depending on a position. In one embodiment, for example, a thickness DK1 of a portion of the second bottom portion BP2 in which the groove HM is not defined may be greater than a thickness DK2 of a portion of the second bottom portion BP2 in which the groove HM is defined.

In one embodiment, for example, when the main circuit board MB (see FIG. 5) is inserted and comes into contact with the pad PD (see FIG. 5), the contact terminal CT may move in the third direction DR3. When the contact terminal CT moves in the third direction DR3, an elastic force may be applied in a direction opposite to the direction in which the contact terminal CT moves. Due to the elastic force, the possibility of the contact failure between the contact terminal CT and the pad PD (see FIG. 5) may be lowered. Therefore, the contact terminal CT may stably contact the pad PD (see FIG. 5).

Figure 6A:
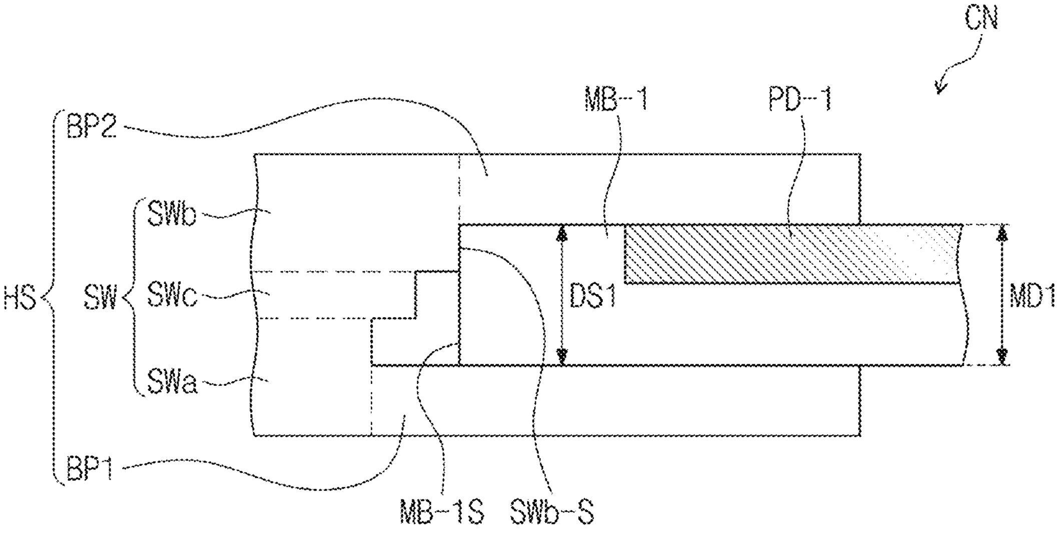
FIG. 6*a* to FIG. 6*c* are cross-sectional views showing a connector and a main circuit board coupled to the connector according to an embodiment of the invention.
Figure 6B:
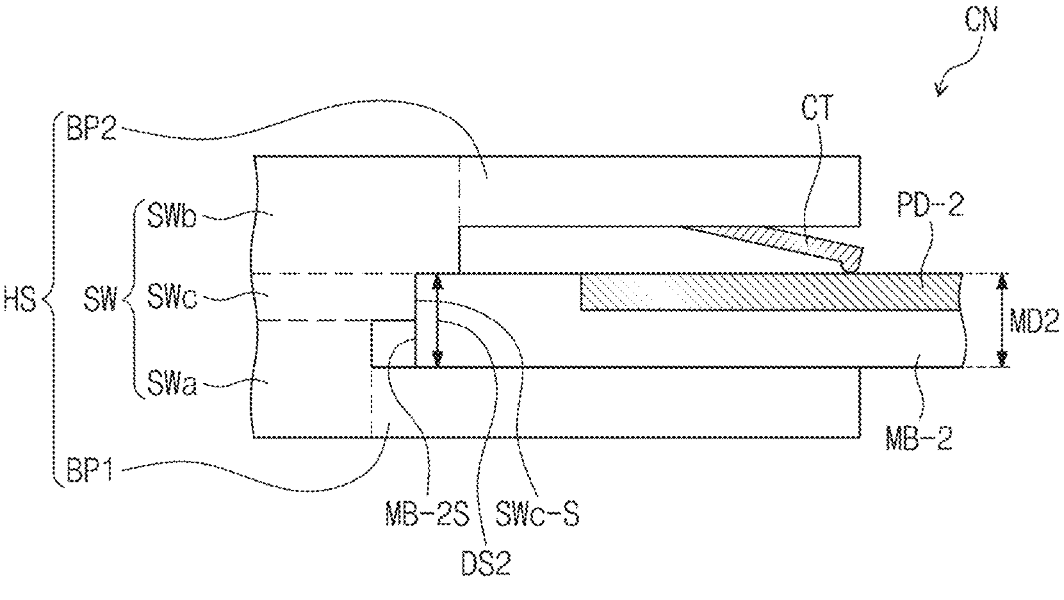
Figure 6C:
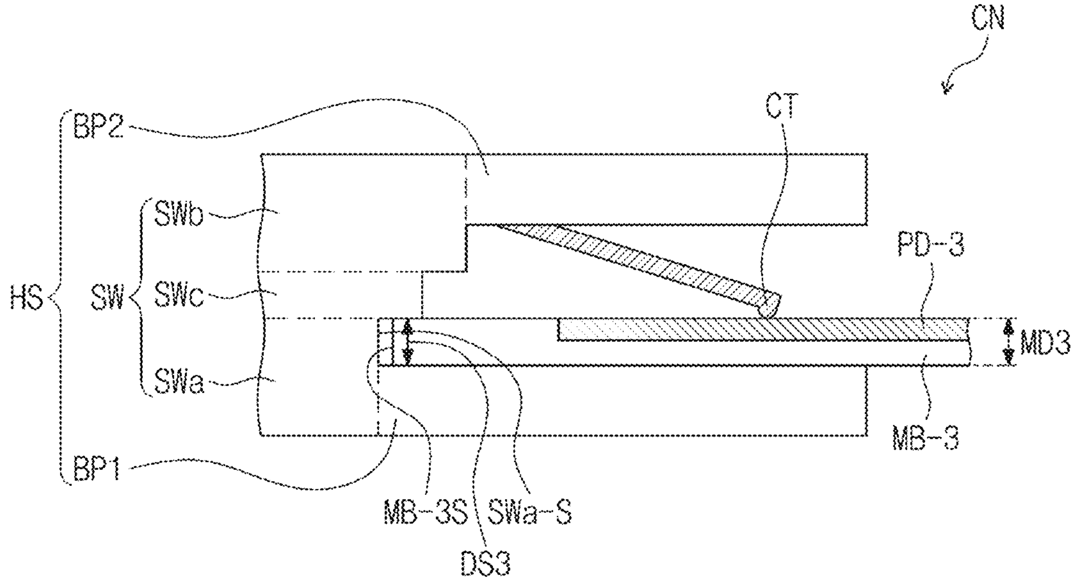

FIG. 6*a* to FIG. 6*c* are cross-sectional views showing a connector and a main circuit board coupled to the connector according to an embodiment of the invention. The same reference numerals are given to the same elements as those described with reference to FIG. 5, and any repetitive detailed description thereof are omitted.

Referring to FIG. 5 and FIG. 6*a*, a main circuit board MB-1 may be inserted into the connector CN and be coupled thereto. A side surface SWb-S of the second partial sidewall portion SWb may face a side surface MB-1S of the main circuit board MB-1. The main circuit board MB-1 may include a pad PD-1. The pad PD-1 may contact the contact terminal CT. The pad PD-1 may be electrically connected to the contact terminal CT. An inspection driving signal may be transmitted to the pad PD-1 through the contact terminal CT. The inspection driving signal transmitted to the pad PD-1 may be transmitted to the display module 200 (see FIG. 3) through the main circuit board MB-1.

A thickness MD1 of the main circuit board MB-1 may be about 1 mm. The first distance DS1 may be about 1 mm. The thickness MD1 of the main circuit board MB-1 and the first distance DS1 may be the same as each other. The main circuit board MB-1 may be coupled to the housing HS and fixed thereto.

Referring to FIG. 5 and FIG. 6*b*, a main circuit board MB-2 may be inserted into the connector CN and be coupled thereto. A side surface SWc-S of the third partial sidewall portion SWc may face a side surface MB-2S of the main circuit board MB-2. The main circuit board MB-2 may include a pad PD-2. The pad PD-2 may contact the contact terminal CT. The pad PD-2 may be electrically connected to the contact terminal CT. An inspection driving signal may be transmitted to the pad PD-2 through the contact terminal CT. The inspection driving signal transmitted to the pad PD-2 may be transmitted to the display module 200 (see FIG. 3) through the main circuit board MB-2.

A thickness MD2 of the main circuit board MB-2 may be about 0.8 mm. The second distance DS2 may be about 0.8 mm. The thickness MD2 of the main circuit board MB-2 and the second distance DS2 may be the same. The main circuit board MB-2 may be coupled to the housing HS and fixed thereto.

Referring to FIG. 5 and FIG. 6*c*, a main circuit board MB-3 may be inserted into the connector CN and be coupled thereto. A side surface SWa-S of the first partial sidewall portion SWa may face a side surface MB-3S of the main circuit board MB-3. The main circuit board MB-3 may include a pad PD-3. The pad PD-3 may contact the contact terminal CT. The pad PD-3 may be electrically connected to the contact terminal CT. An inspection driving signal may be transmitted to the pad PD-3 through the contact terminal CT. The inspection driving signal transmitted to the pad PD-3 may be transmitted to the display module 200 (see FIG. 3) through the main circuit board MB-3.

A thickness MD3 of the main circuit board MB-3 may be about 0.6 mm. The third distance DS3 may be about 0.6 mm. The thickness MD3 of the main circuit board MB-3 and the third distance DS3 may be the same. The main circuit board MB-3 may be coupled to the housing HS and fixed thereto.

Referring to FIG. 5, and FIG. 6*a* to FIG. 6*c*, the thickness of the main circuit board MB (see FIG. 4) which may be connected to the connector CN may not be limited to a specific thickness. In a conventional connector, the space inside a housing may have a constant width. In such a conventional connector, when the thickness of the main circuit board MB (see FIG. 4) is less than a predetermined thickness, the main circuit board MB (see FIG. 4) may not be stably coupled to the connector. That is, the fixing force between the main circuit board MB (see FIG. 4) and the connector reduces, so that there may be a high possibility of contact failure. In addition, when the thickness of the main circuit board MB (see FIG. 4) is equal to or greater than a predetermined thickness, the main circuit board MB (see FIG. 4) may not be inserted into the connector. According to embodiments of the invention, a sidewall of the housing HS of the connector CN may have a stepped shape. The main circuit boards MB-1, MB-2, and MB-3 having different thicknesses may be stably connected to the connector CN. The connector CN may prevent contact failure with each of the main circuit boards MB-1, MB-2, and MB-3. Therefore, the connector CN having improved connection reliability may be provided.

Figure 7:
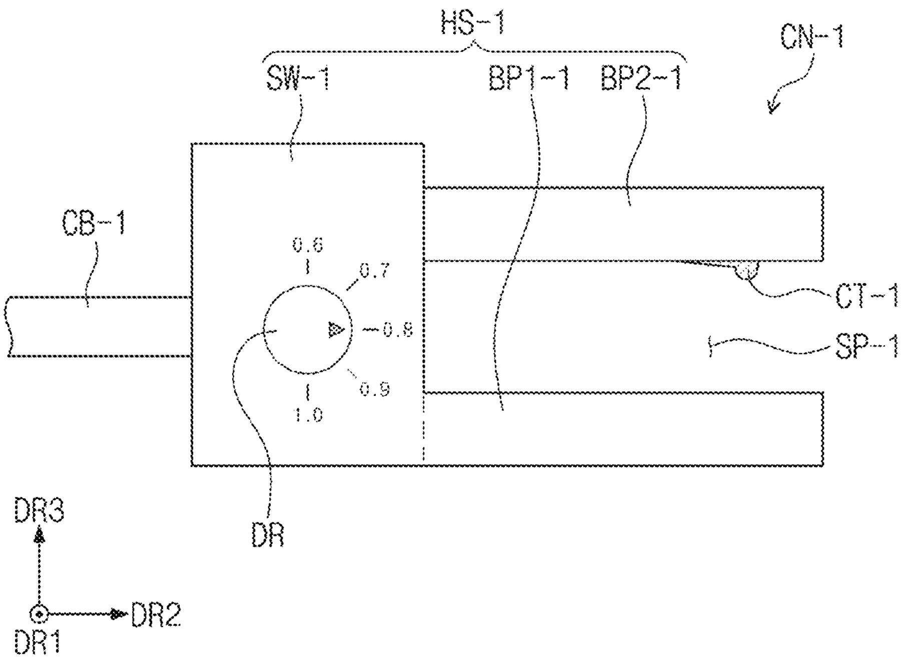
FIG. 7 is a side view of a connector according to an alternative embodiment of the invention.
Figure 8:
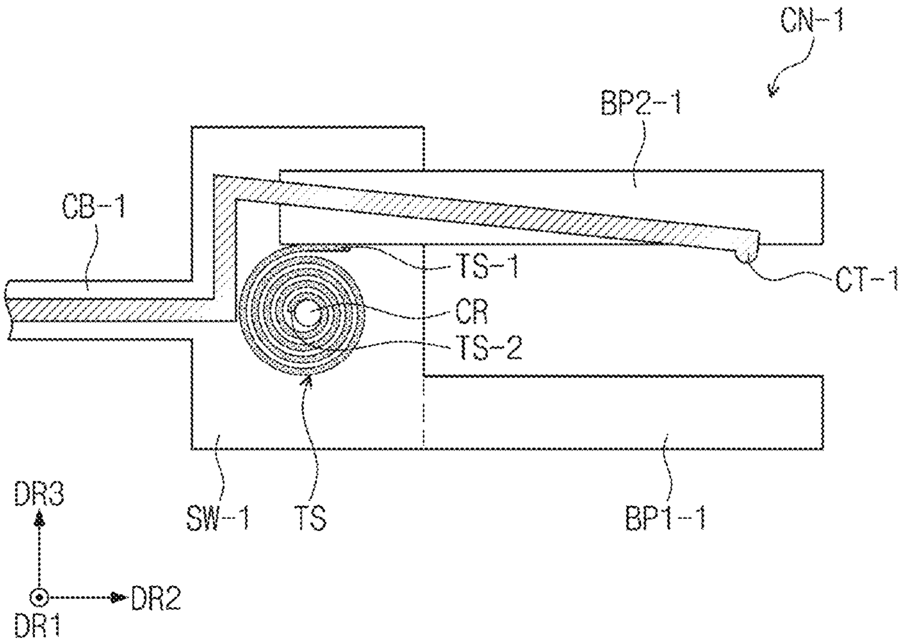
FIG. 8 is a transmissive cross-sectional view of a connector according to an alternative embodiment of the invention.

FIG. 7 is a side view of a connector according to an alternative embodiment of the invention, and FIG. 8 is a transmissive cross-sectional view of a connector according to an alternative embodiment of the invention.

Referring to FIG. 7 and FIG. 8, a connector CN-1 may include a housing HS-1, a contact terminal CT-1, a control unit, and a spacing control unit TS. The connector CN-1 may be connected to a cable CB-1. The housing HS-1 may include a sidewall portion SW-1, a first bottom portion BP1-1 protruding from the sidewall portion SW-1, and a second bottom portion BP2-1 protruding from the sidewall portion SW-1 and facing the first bottom portion BP1-1. The second bottom portion BP2-1 may be slid in the third direction DR3 along a thickness direction of the sidewall portion SW-1. An internal space SP-1 may be defined by the sidewall portion SW-1, the first bottom portion BP1-1, and the second bottom portion BP2-1.

The contact terminal CT-1 may be disposed in the internal space SP-1. The contact terminal CT-1 may be disposed in the second bottom portion BP2-1. An end of the contact terminal CT-1 may protrude from the second bottom portion BP2-1 toward the first bottom portion BP1-1 in the third direction DR3 to effectively come into contact with the pad PD (see FIG. 5).

The control unit is coupled to the spacing control unit TS to control the distance between the first bottom portion BP1-1 and the second bottom portion BP2-1. The control unit may change the shape of the spacing control unit TS.

The spacing control unit TS may be disposed inside the housing HS-1. The spacing control unit TS may include a material having elasticity. In one embodiment, for example, the spacing control unit TS may include a spiral spring. The spacing control unit TS may include a first end TS-1 and a second end TS-2. The first end TS-1 may be coupled to the second bottom portion BP2-1. The second end TS-2 may be coupled to the control unit.

The control unit may include a dial DR disposed on one surface of the sidewall portion SW-1. In such an embodiment, force applied to the spacing control unit TS may be adjusted by rotating the dial DR of the control unit.

In one embodiment, for example, by rotating the dial DR in a counterclockwise direction, the control unit may rotate in the counterclockwise direction to transmit force to the second end TS-2. The spacing control unit TS may be compressed by the force transmitted to the second end TS-2. As the spacing control unit TS is compressed, force may be applied in the third direction DR3 in which the second bottom portion BP2-1 becomes closer to the first bottom portion BP1-1. The second bottom portion BP2-1 may be slid to be close to the first bottom portion BP1-1. The distance between the first bottom portion BP1-1 and the second bottom portion BP2-1 may become shorter.

In one embodiment, for example, by rotating the dial DR in a clockwise direction, the control unit may rotate in the clockwise direction to transmit force to the second end TS-2. The spacing control unit TS may be restored to the original shape thereof by the force transmitted to the second end TS-2. As the spacing control unit TS is restored, force may be applied on the second bottom portion BP2-1 in the third direction DR3 moving away from the first bottom portion BP1-1. The second bottom portion BP2-1 may be slid to be away from the first bottom portion BP1-1. The distance between the first bottom portion BP1-1 and the second bottom portion BP2-1 may become greater.

Figure 9A:
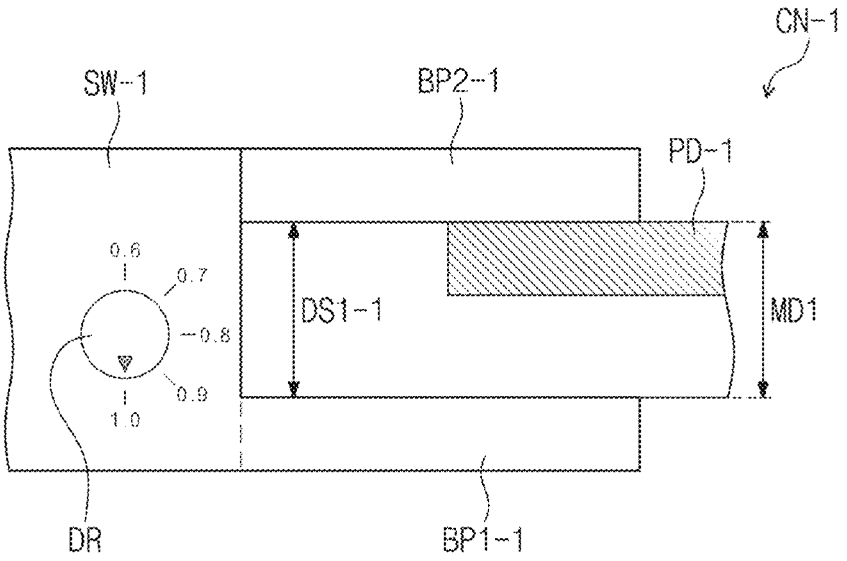
FIG. 9*a* to FIG. 9*c* are side views showing a connector and a main circuit board coupled to the connector according to an alternative embodiment of the invention.
Figure 9B:
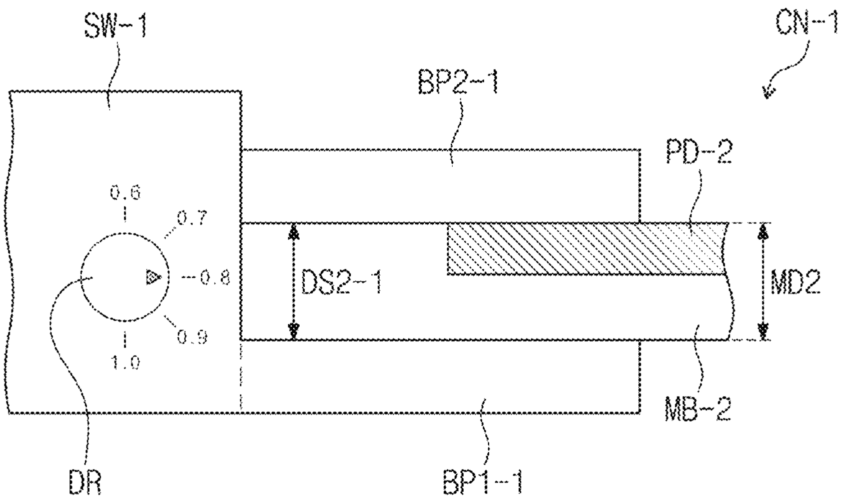
Figure 9C:
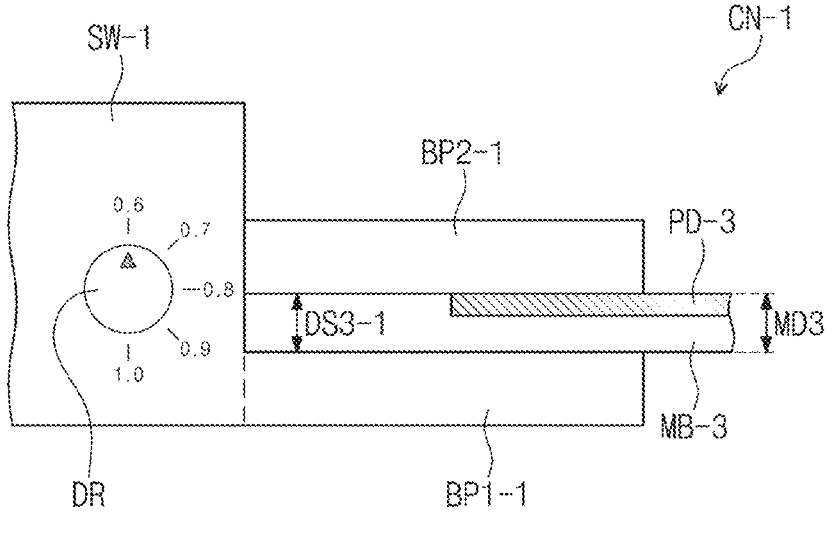

FIG. 9*a* to FIG. 9*c* are side views showing a connector and a main circuit board coupled to the connector according to an alternative embodiment of the invention. The same reference numerals are given to the same elements as those described with reference to FIG. 7 and FIG. 8, and any repetitive detailed description thereof are omitted.

Referring to FIG. 8 and FIG. 9*a*, the main circuit board MB-1 may be inserted into the connector CN-1 and be coupled thereto. The main circuit board MB-1 may include the pad PD-1. The pad PD-1 may contact the contact terminal CT. The pad PD-1 may be electrically connected to the contact terminal CT. An inspection driving signal may be transmitted to the pad PD-1 through the contact terminal CT. The inspection driving signal transmitted to the pad PD-1 may be transmitted to the display module 200 (see FIG. 3) through the main circuit board MB-1.

The thickness MD1 of the main circuit board MB-1 may be about 1 mm. The control unit CR may control the shape of the spacing control unit TS through the dial DR to adjust a first distance DS1-1 between the first bottom portion BP1-1 and the second bottom portion BP2-1. The first distance DS1-1 may be about 1 mm. The thickness MD1 of the main circuit board MB-1 and the first distance DS1-1 may be the same as each other. The main circuit board MB-1 may be coupled between the first bottom portion BP1-1 and the second bottom portion BP2-1 and be fixed.

Referring to FIG. 8 and FIG. 9*b*, the main circuit board MB-2 may be inserted into the connector CN-1 and be coupled thereto. The main circuit board MB-2 may include the pad PD-2. The pad PD-2 may contact the contact terminal CT. The pad PD-2 may be electrically connected to the contact terminal CT. An inspection driving signal may be transmitted to the pad PD-2 through the contact terminal CT. The inspection driving signal transmitted to the pad PD-2 may be transmitted to the display module 200 (see FIG. 3) through the main circuit board MB-2.

The thickness MD2 of the main circuit board MB-2 may be about 0.8 mm. The control unit CR may control the shape of the spacing control unit TS through the dial DR to adjust a second distance DS2-1 between the first bottom portion BP1-1 and the second bottom portion BP2-1. The second distance DS2-1 may be about 0.8 mm. The thickness MD2 of the main circuit board MB-2 and the second distance DS2-1 may be the same as each other. The main circuit board MB-2 may be coupled between the first bottom portion BP1-1 and the second bottom portion BP2-1 and be fixed.

Referring to FIG. 8 and FIG. 9*c*, the main circuit board MB-3 may be inserted into the connector CN-1 and be coupled thereto. The main circuit board MB-3 may include the pad PD-3. The pad PD-3 may contact the contact terminal CT. The pad PD-3 may be electrically connected to the contact terminal CT. An inspection driving signal may be transmitted to the pad PD-3 through the contact terminal CT. The inspection driving signal transmitted to the pad PD-3 may be transmitted to the display module 200 (see FIG. 3) through the main circuit board MB-3.

The thickness MD3 of the main circuit board MB-3 may be about 0.6 mm. The control unit CR may control the shape of the spacing control unit TS through the dial DR to adjust a third distance DS3-1 between the first bottom portion BP1-1 and the second bottom portion BP2-1. The third distance DS3-1 may be about 0.6 mm. The thickness MD3 of the main circuit board MB-3 and the third distance DS3-1 may be the same as each other. The main circuit board MB-3 may be coupled between the first bottom portion BP1-1 and the second bottom portion BP2-1 and be fixed.

Referring to FIG. 7, FIG. 8, and FIG. 9*a* to FIG. 9*c*, the thickness of the main circuit board MB (see FIG. 4) which may be connected to the connector CN-1 may not be limited to a specific thickness. In a conventional connector, the space inside a housing may have a constant width. In such a conventional connector, when the thickness of the main circuit board MB (see FIG. 4) is less than a predetermined thickness, the main circuit board MB (see FIG. 4) may not be stably coupled to the connector. That is, the fixing force between the main circuit board MB (see FIG. 4) and the connector reduces, so that there may be a high possibility of contact failure. In addition, when the thickness of the main circuit board MB (see FIG. 4) is equal to or greater than a predetermined thickness, the main circuit board MB (see FIG. 4) may not be inserted into the connector. According to embodiments of the invention, the distance between the first bottom portion BP1-1 and the second bottom portion BP2-1 of the connector CN-1 may be adjusted by the spacing control unit TS. The main circuit boards MB-1, MB-2, and MB-3 having different thicknesses may be stably connected to the connector CN-1. The connector CN-1 may prevent contact failure with each of the main circuit boards MB-1, MB-2, and MB-3. Therefore, the connector CN-1 having improved connection reliability may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

In order to secure the reliability of a display panel, a procedure for verifying the display panel is essential in a development and manufacturing process thereof. At this time, the display panel may be connected using a connector to an inspection device. Therefore, embodiments of the invention with regard to the connector has high industrial applicability.

The invention claimed is:

1. A connector comprising:

a housing including a sidewall portion, a first bottom portion protruding from the sidewall portion, and a second bottom portion protruding from the sidewall portion and facing the first bottom portion; and a contact terminal disposed in an internal space of the housing, wherein the sidewall portion includes:

a first partial sidewall portion having a first width; and a second partial sidewall portion having a second width more than the first width, wherein the sidewall portion, the first bottom portion, and the second bottom portion define the internal space, wherein the internal space is configured to receive circuit boards in a receiving direction parallel to the first width and the second width, wherein the contact terminal is configured such that, when a side surface of the first partial sidewall portion is in direct contact with a side surface of a circuit board, the contact terminal moves a first length in a direction opposite to the receiving direction to a top surface of the circuit board, wherein the contact terminal is further configured such that, when a side surface of the second partial sidewall portion is in direct contact with a side surface of a circuit board, the contact terminal moves a second length in the direction opposite to the receiving direction to a top surface of the circuit board, the second length greater than the first length.

2. The connector of claim 1, wherein the contact terminal is disposed in the second bottom portion.

3. The connector of claim 2, wherein the contact terminal protrudes from the second bottom portion toward the first bottom portion.

4. The connector of claim 1, wherein the first bottom portion is adjacent to the first partial sidewall portion, and the second bottom portion is adjacent to the second partial sidewall portion.

5. The connector of claim 1, wherein a distance between the first bottom portion and the second bottom portion is greater than a distance between the first bottom portion and the first partial sidewall portion.

6. The connector of claim 1, further comprising a third partial sidewall portion disposed between the first partial sidewall portion and the second partial sidewall portion.

7. The connector of claim 6, wherein the third partial sidewall portion has a third width, wherein the third width is greater than the first width but less than the second width.

8. The connector of claim 6, wherein the first partial sidewall portion, the second partial sidewall portion, and the third partial sidewall portion collectively define a stepped shape.

9. The connector of claim 6, wherein a distance between the first bottom portion and the third partial sidewall portion is about 0.6 mm.

10. The connector of claim 6, wherein a distance between the first bottom portion and the second partial sidewall portion is about 0.8 mm.

11. The connector of claim 6, wherein a distance between the first bottom portion and the second bottom portion is about 1 mm.

12. A connector comprising:

a housing including a sidewall portion, a first bottom portion protruding from the sidewall portion, and a second bottom portion protruding from the sidewall portion and facing the first bottom portion;

a contact terminal disposed in an internal space of the housing; and a spacing control unit disposed inside the housing; and a control unit coupled to the spacing control unit to control a distance between the first bottom portion and the second bottom portion, wherein the sidewall portion, the first bottom portion, and the second bottom portion define the internal space, and wherein the control unit comprises a dial disposed on one surface of the sidewall portion to control the spacing control unit.

13. The connector of claim 12, wherein the second bottom portion is slidable along a thickness direction toward or away from the first bottom portion.

14. The connector of claim 12, wherein the contact terminal is disposed in the second bottom portion.

15. The connector of claim 14, wherein the contact terminal protrudes from the second bottom portion toward the first bottom portion.

16. The connector of claim 12, wherein the spacing control unit comprises a material having elasticity.

17. The connector of claim 12, wherein a first end of the spacing control unit is coupled to the second bottom portion, and a second end of the spacing control unit is coupled to the control unit.

* * * * *